US012309974B2

(12) United States Patent
MacManus (10) Patent No.: US 12,309,974 B2
(45) Date of Patent: May 20, 2025

(54) THERMAL MANAGEMENT IN AN ELECTRONIC DEVICE CHASSIS (71) Applicant: Rakuten Symphony, Inc., Tokyo (JP)

(72) Inventor: Gerard MacManus, Surrey (GB)

(73) Assignee: Rakuten Symphony, Inc., Tokyo (JP)

( * ) Notice: Subject to any disclaimer, the term of this patent is extended or adjusted under 35 U.S.C. 154(b) by 0 days.

(21) Appl. No.: 18/021,605

(22) PCT Filed: Jul. 29, 2022

(86) PCT No.: PCT/US2022/038825
§ 371 (c)(1),
(2) Date: Feb. 16, 2023

(87) PCT Pub. No.: WO2023/229621
PCT Pub. Date: Nov. 30, 2023

(65) Prior Publication Data
US 2024/0268073 A1 Aug. 8, 2024

Related U.S. Application Data (60) Provisional application No. 63/345,777, filed on May 25, 2022.

(51) Int. Cl.
*H01L 23/36* (2006.01)
*H05K 1/02* (2006.01)
(Continued)

(52) U.S. Cl.
CPC ......... *H05K 7/2039* (2013.01); *H05K 1/0201* (2013.01); *H05K 1/14* (2013.01)

(58) Field of Classification Search
CPC ............ H01L 23/36; H01L 2023/4043; H01L 21/4882; H01L 2023/405; H05K 7/20336;
(Continued)

(56) References Cited

U.S. PATENT DOCUMENTS 5,430,611 A * 7/1995 Patel ..................... H01L 23/467
257/E23.09
5,508,884 A * 4/1996 Brunet .................. H01L 23/427
361/698

(Continued)

FOREIGN PATENT DOCUMENTS

WO 2021/252034 A1 12/2021

OTHER PUBLICATIONS

International Search Report and Written Opinion of the International Searching Authority issued by the United States Patent and Trademark Office for corresponding International Patent Application No. PCT/US2022/038825, electronically delivered on Oct. 28, 2022.

*Primary Examiner* — Mandeep S Buttar
(74) *Attorney, Agent, or Firm* — Myers Wolin, LLC (57) ABSTRACT

A chassis is provided for supporting electronic device circuitry. The chassis generally includes a mounting surface on a first side of the chassis and a cooling surface on a second side of the chassis opposite the mounting surface. The cooling surface has a plurality of heatsink fins extending from the cooling surface. The chassis also has at least one vapor chamber between the mounting surface and the cooling surface. The vapor chamber is located adjacent the plurality of heatsink fins.

13 Claims, 11 Drawing Sheets

(51) Int. Cl.
*H05K 1/14* (2006.01)
*H05K 7/20* (2006.01)

(58) Field of Classification Search
CPC .............. H05K 7/20409; H05K 7/209; H05K 7/20154; H05K 7/20518; H05K 7/20936; H05K 7/20909; G06F 1/20
See application file for complete search history.

(56) References Cited

U.S. PATENT DOCUMENTS

| | | | | |
|---|---|---|---|---|
| 5,880,524 | A * | 3/1999 | Xie | H01L 23/433 |
| | | | | 257/E23.09 |
| 10,381,287 | B1 * | 8/2019 | Saunders | H01L 23/3735 |
| 10,622,282 | B2 * | 4/2020 | Prajapati | H05K 7/20318 |
| 11,769,710 | B2 * | 9/2023 | Refai-Ahmed | H01L 25/167 |
| | | | | 257/714 |
| 11,810,836 | B2 * | 11/2023 | Doria | H01L 23/4006 |
| 2004/0190253 | A1 * | 9/2004 | Prasher | H01L 23/427 |
| | | | | 361/699 |
| 2005/0274487 | A1 | 12/2005 | Goth | |
| 2006/0034052 | A1 * | 2/2006 | Chang | H05K 7/20254 |
| | | | | 361/697 |
| 2007/0012429 | A1 | 1/2007 | Siu | |
| 2015/0035129 | A1 * | 2/2015 | Zhang | H01L 23/49562 |
| | | | | 438/107 |
| 2016/0330868 | A1 | 11/2016 | Sun et al. | |
| 2017/0156240 | A1 * | 6/2017 | Silvennoinen | H05K 7/20936 |
| 2018/0203496 | A1 * | 7/2018 | Campbell | H05K 3/3436 |
| 2021/0407879 | A1 * | 12/2021 | Patel | H01L 23/3672 |

\* cited by examiner

THERMAL MANAGEMENT IN AN ELECTRONIC DEVICE CHASSIS

CROSS-REFERENCE TO RELATED APPLICATION

This application is a national stage application of International Application No. PCT/US2022/038825, filed on Jul. 29, 2022 and designated the U.S., which claims priority to U.S. Provisional Patent Application No. 63/345,777, filed on May 25, 2022. The contents of each are herein incorporated by reference.

FIELD OF THE INVENTION

This application relates to a chassis for thermal management in an electronic device, such as a wireless communication device. In particular, this application relates to thermal management structures that work in concert within and around a chassis for a wireless device, such as a mMIMO (massive Multiple-Input Multiple-Output) device.

BACKGROUND

Various electronic devices may comprise various circuit boards and other electronic components mounted on cooling structures. Such cooling structures may include a chassis with a mounting surface on one side and various cooling features integrated into the chassis. Such cooling features may include cooling fins on a side of the chassis opposite the mounting surface, such that the cooling fins can draw heat away from a circuit board or other electronic components mounted on the mounting surface.

As an example, wireless communication devices such as mMIMO (massive Multiple-Input Multiple-Output) devices may be cooled using a chassis having a mounting surface on one side and may be cooled by either a fan or a fanless structure. This may include a fanless conductor, such as a finned heatsink, or a combination of fanless and fan-cooled structures, depending on the size of the device and/or power consumption requirements. Devices are typically designed and constructed to be either fanless or fan-cooled.

There is a need for a thermal management system for use in an electronic device chassis that addresses heat management issues at the system level. There is a further need for such a thermal management system that utilizes different thermal management techniques and structures tailored to the specific needs and locations of electronic device circuitry for a particular application.

SUMMARY

A chassis is provided for supporting electronic device circuitry. The chassis generally includes a mounting surface on a first side of the chassis and a cooling surface on a second side of the chassis opposite the mounting surface. The cooling surface has a plurality of heatsink fins extending from the cooling surface. The chassis also has at least one vapor chamber between the mounting surface and the cooling surface. The vapor chamber is located adjacent the plurality of heatsink fins.

The chassis may have at least one thermal break. In such an embodiment, the plurality of heatsink fins is organized into at least two fin sections. A first fin section of the at least two fin sections comprises a first set of fins of the plurality of fins. A second fin section of the at least two fin sections comprises a second set of fins of the plurality of fins. The at least one thermal break is then an air gap defining a channel between the first fin section and the second fin section.

In some such embodiments having at least one thermal break, a first vapor chamber of the at least one vapor chamber is adjacent the first fin section and a second vapor chamber of the at least one vapor chamber is adjacent the second fin section. Typically, no vapor chamber is then provided adjacent the thermal break.

In some such embodiments, the electronic device circuitry comprises a plurality of printed circuit boards (PCBs) and each of the first vapor chamber and the second vapor chamber are located between a corresponding PCB mounting location on the mounting surface and the corresponding fin section on the cooling surface.

In some such embodiments, the first vapor chamber and the second vapor chamber are sized to meet thermal loads associated with a specified PCB to be mounted at the corresponding PCB mounting location.

In some embodiments, at least one of the PCBs includes an electronic device surface mounted on the PCB such that the PCB intercedes between the electronic device and the mounting surface. In such an embodiment, the PCB further comprises thermal vias defining a thermal path between the electronic device and the mounting surface. In some such embodiments, the electronic device surface mounted is an integrated circuit die mounted on a die-attach paddle. The thermal vias are then located adjacent the die-attach paddle.

In some embodiments, a first plurality of vapor chambers of the at least one vapor chamber is adjacent the first fin section. A second plurality of vapor chambers of the at least one vapor chamber is similarly adjacent the second fin section, and no vapor chamber is adjacent the thermal break.

In some such embodiments, the electronic device circuitry comprises a plurality of printed circuit boards (PCBs). Each of the first plurality of vapor chambers and the second plurality of vapor chambers are then located between a corresponding PCB mounting location on the mounting surface and the corresponding fin section on the cooling surface. Each PCB may then comprise several groupings of circuitry with discrete thermal management requirements, and vapor chambers of the first plurality of vapor chambers and the second plurality of vapor chambers may be configured to be located adjacent corresponding groupings of circuitry. Each vapor chamber is then sized for the thermal management requirements of the corresponding grouping of circuitry.

In some such embodiments, each PCB comprises at least four field programmable gate arrays (FPGAs), and wherein each FPGA is associated with a corresponding vapor chamber.

In some embodiments, each fin of the plurality of heatsink fins is a pressed or bonded fin.

In some embodiments, each fin of the plurality of heatsink fins comprises at least two materials.

In some embodiments, each fin of the plurality of heatsink fins comprises at least one integrated fluid path. In some such embodiments, each fin of the plurality of heatsink fins is a 2-phase fin.

In some embodiments, each of the heatsink fins is spaced and sized to optimize thermal management of the device. In some such embodiments, the heatsink fin quantity, pitch, and size are customized based on printed circuit boards to be mounted on the mounting surface.

In some embodiments, the device chassis comprises a high pressure die cast base.

In some embodiments, the chassis or device includes a fan module mounted adjacent a first end of the cooling surface.

DETAILED DESCRIPTION OF THE PREFERRED EMBODIMENTS

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Figure 1:
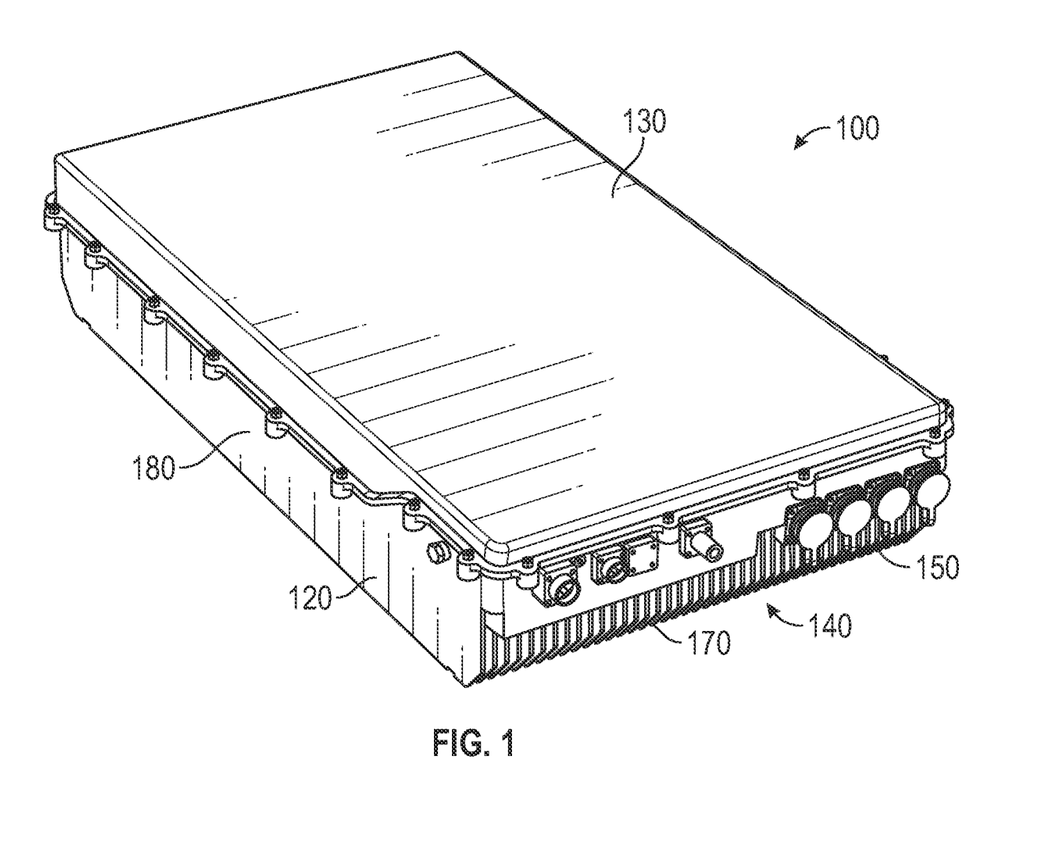
FIG. 1 is a device in accordance with this disclosure.
Figure 2:
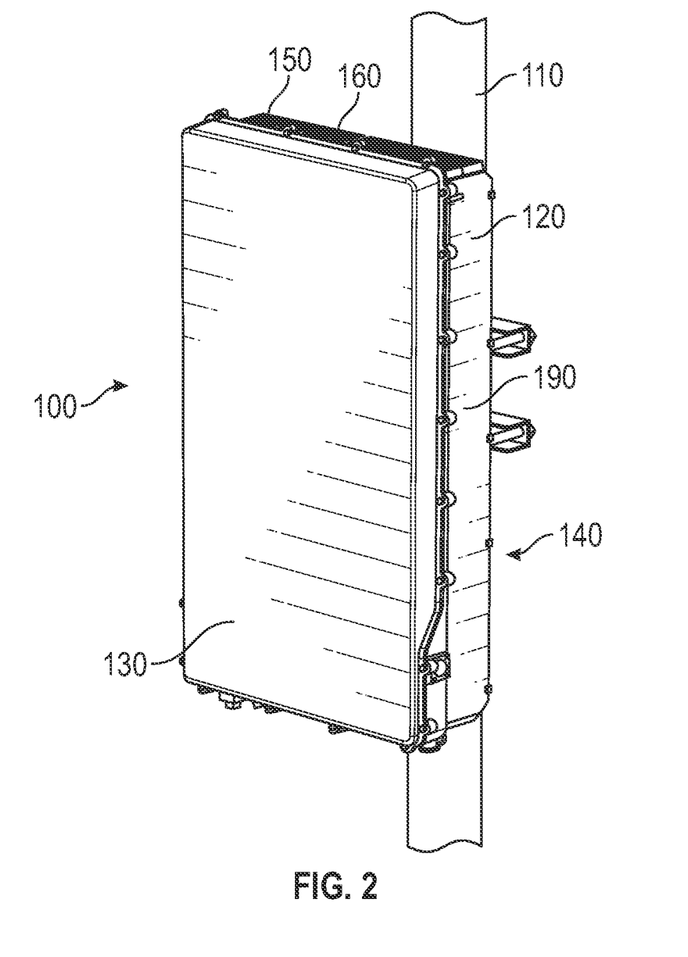
FIG. 2 is the device of FIG. 1 mounted on a post.
Figure 3:
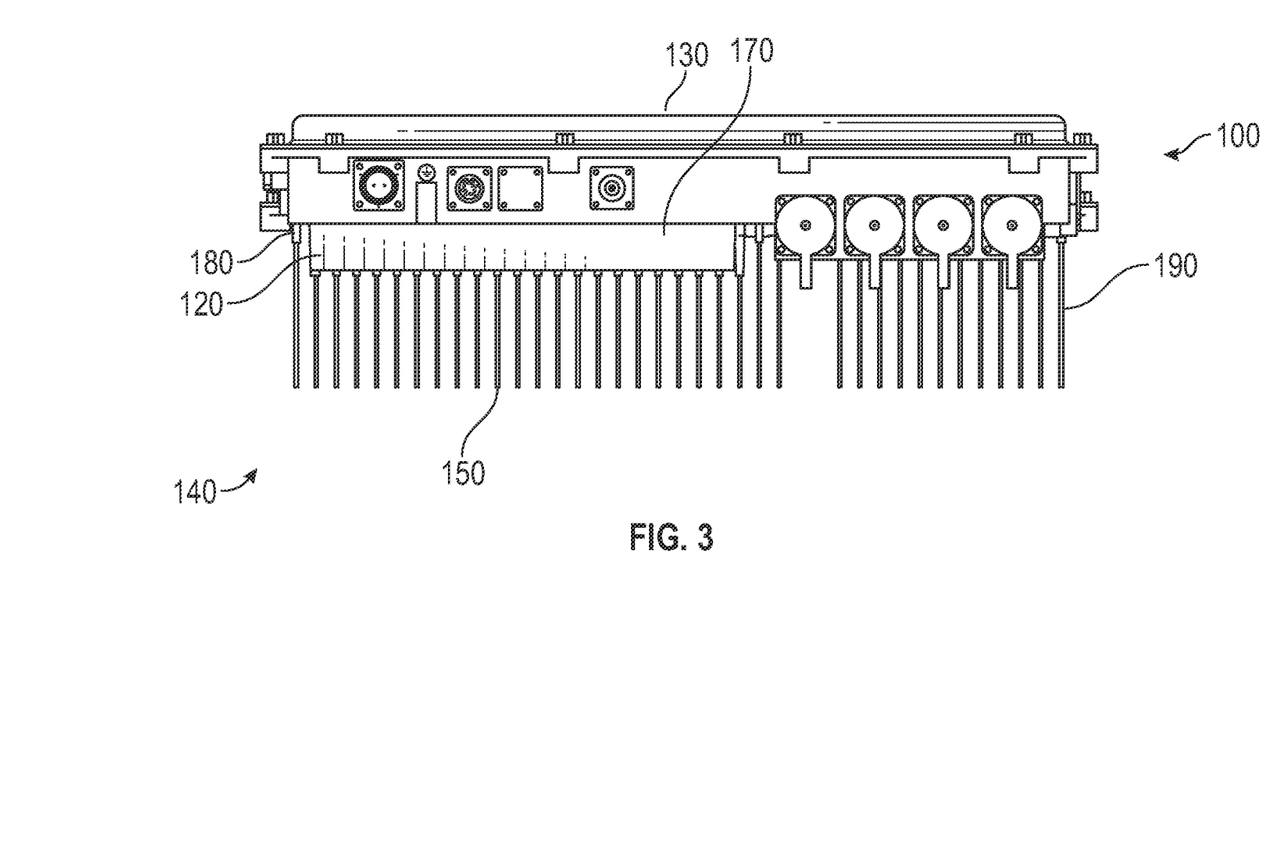
FIG. 3 is a top view of the device of FIG. 1.

FIG. 1 is a device 100 in accordance with this disclosure. FIG. 2 is the device 100 of FIG. 1 mounted on a post 110. FIG. 3 is a top view of the device 100 of FIG. 1.

As shown, the device 100 may include a chassis 120 supporting various electronics, such as an mMIMO (massive Multiple-Input Multiple-Output) device with significant cooling requirements. The electronics may be installed in a housing 130 installed on the chassis 120. As such, the housing 130 may enclose a mounting surface supporting various circuit boards and other electronic devices that require cooling.

Opposite the housing 130, the chassis 120 may provide a cooling heatsink 140, which may be a fan-cooled or fanless structure comprising a large number of fins 150. The fins 150, along with portions of the chassis 130 itself, are typically formed from a conductive material and thereby draw heat away from the housing 130. Accordingly, the chassis 120 typically has a mounting surface on a first side, and the fins 150 extend from the chassis on a second side opposite the circuit board mounting surface.

As shown in FIG. 2, during use, the device 100 may be installed on a post 110, such that at least some of the fins 150 are located adjacent the post. As such, the chassis 120 may be designed such that as much heat as possible can be removed from the fins at the top 160, bottom 170, and sides 180, 190 of the device 100.

Figure 4:
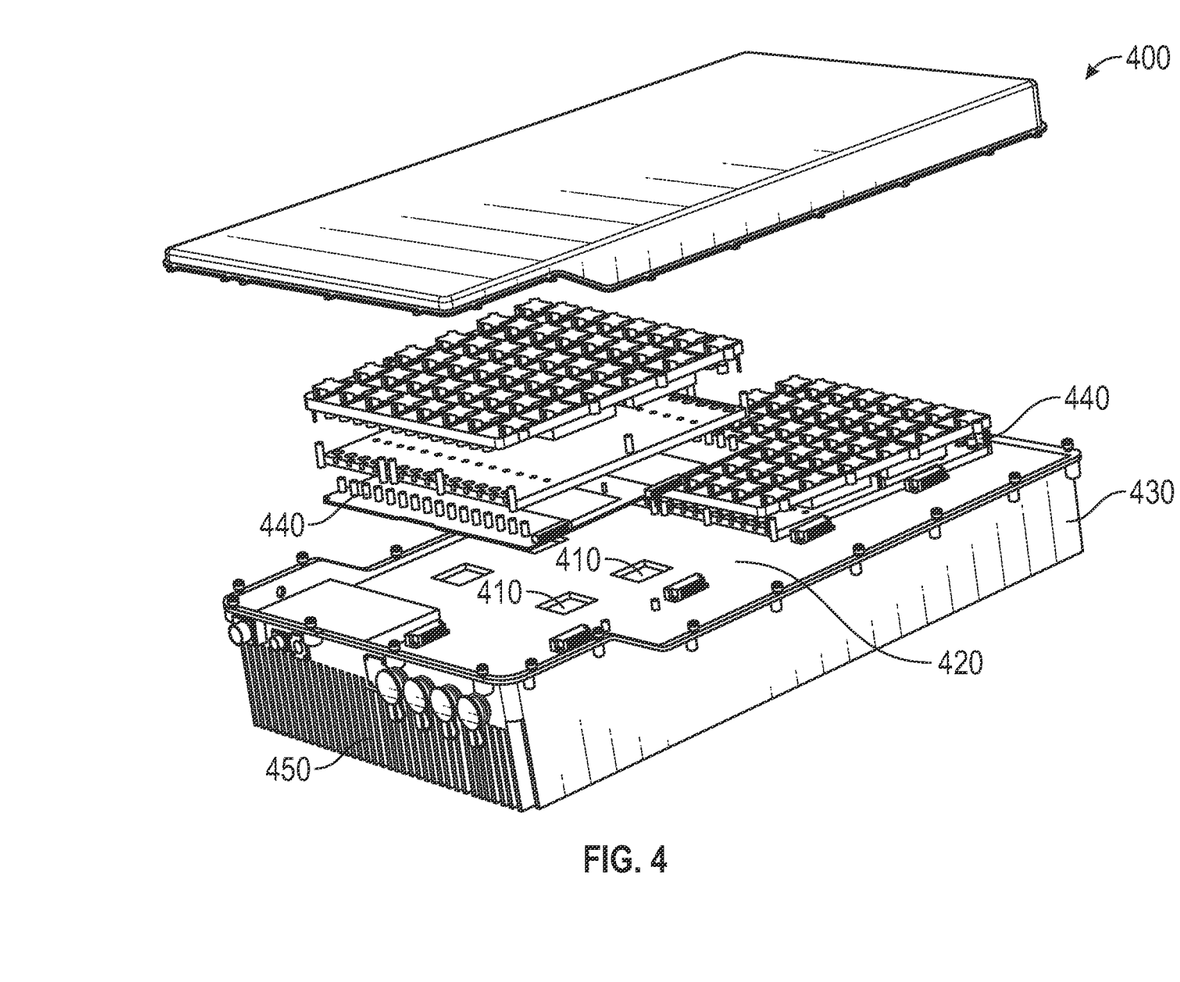
FIG. 4 is an exploded view of a device in accordance with this disclosure.

FIG. 4 is an exploded view of a device 400 in accordance with this disclosure. As shown, the devices 400 discussed herein may utilize at least one vapor chamber 410. Such vapor chambers 410 may be integrated into a mounting surface 420 of a chassis 430 for the device. Each vapor chamber 410 may be an enclosure filled with a small amount of liquid, such as water. The vapor chamber 410 may then be vacuum sealed, and pressure within the chamber may be set to allow the fluid to vaporize at a desired temperature.

During use, the vapor chamber 410 may be located below circuitry integrated into or located on a circuit board 440, such as a printed circuit board (PCB), or other heat generating electronics. The circuit board 440 may be designed to interact with and transfer heat to the vapor chamber 410. Accordingly, when the circuit board 440 heats up during use, such heat is transferred to an adjacent vapor chamber 410. The fluid in the vapor chamber 440 then vaporizes and circulates through the enclosure.

In the embodiment shown, the chassis 430 includes a cooling surface having cooling fins 450 located opposite the chassis from the mounting surface 420. Accordingly, when the vapor circulates within the vapor chamber 410, heat can be transferred from the mounting surface 420 to the fins 450 through the chassis 430 more efficiently than would otherwise occur. When the vapor in the vapor chamber 410 transfers heat to the cooling fins 450, the temperature of the vapor is lowered, and the vapor can return to liquid form and return to the surface of the vapor chamber adjacent the circuit board 440 in order to begin the heat transfer process again.

This works both because vapor can be moved in a controlled manner across the thickness of the vapor chamber 410 using, for example, wicking elements, and because vapor can distribute heat evenly across a wider space, thereby transferring heat to a larger number of cooling fins 450. Because of the phase changes, vapor carrying heat can move in one direction, while liquid fluid can be returned to the portion of the vapor chamber 410 adjacent the mounting surface in order to absorb additional heat.

Figure 5:
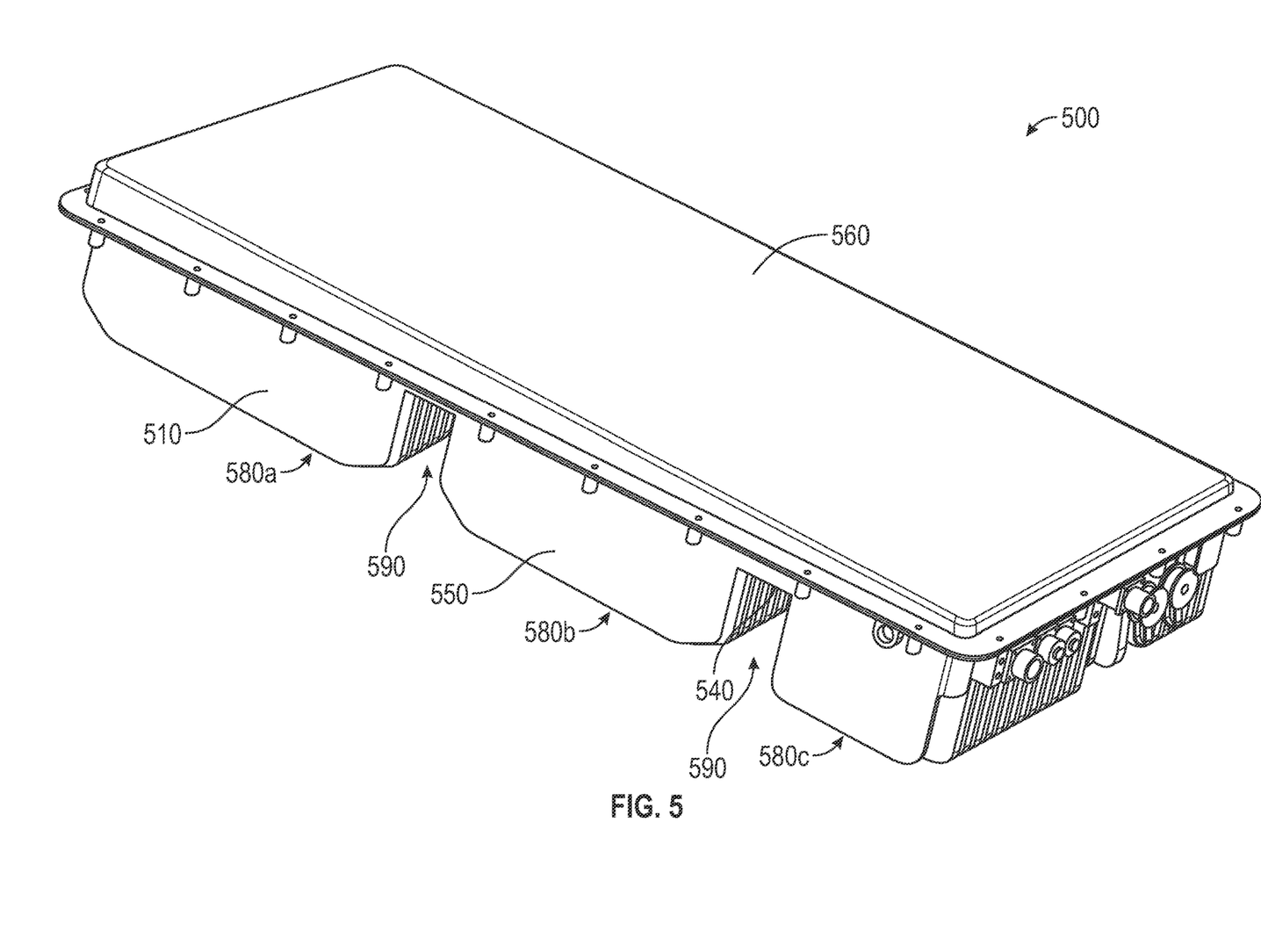
FIG. 5 is a perspective view of a device in accordance with this disclosure.
Figure 6:
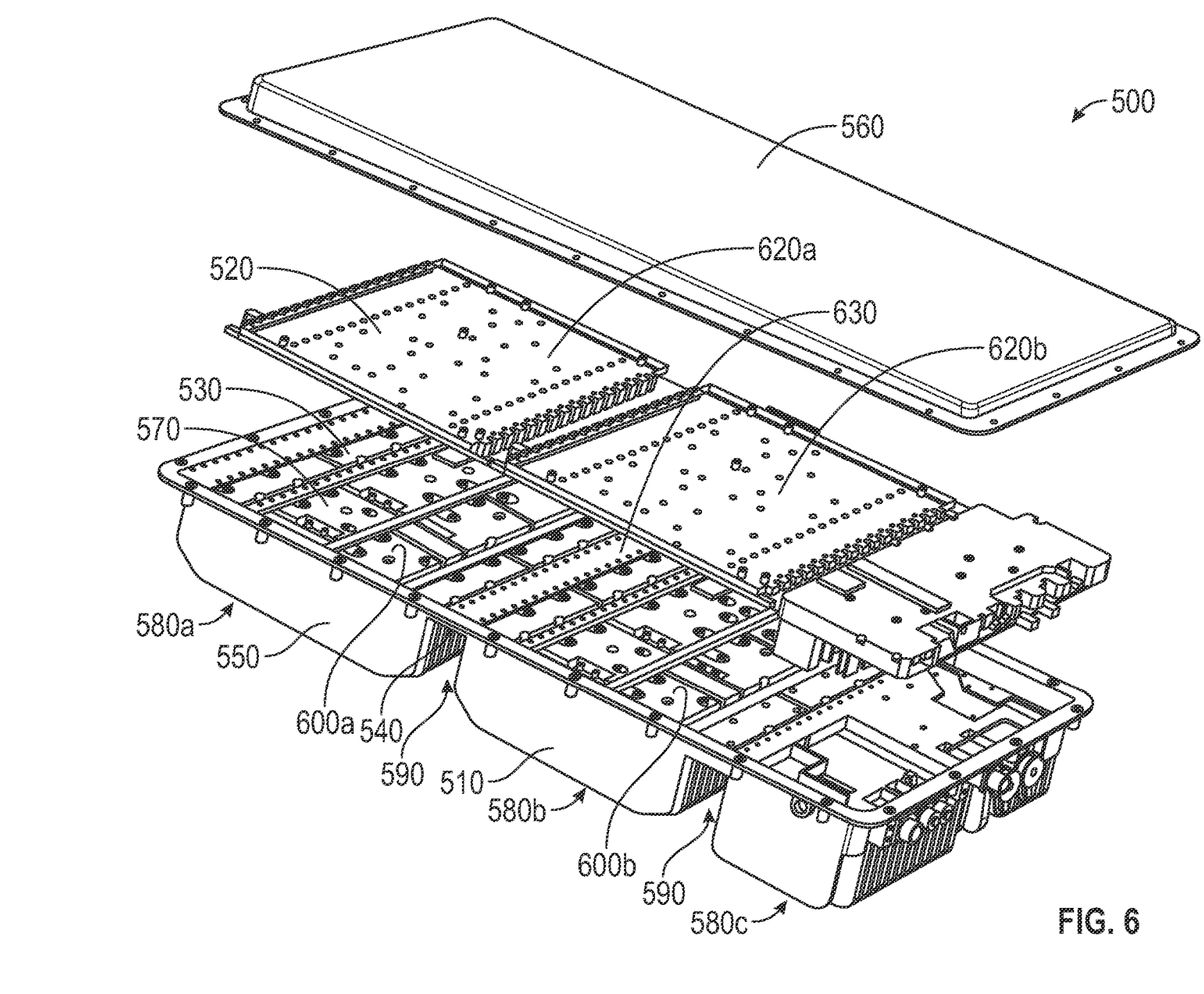
FIG. 6 is an exploded view of the device of FIG. 5.
Figure 7:
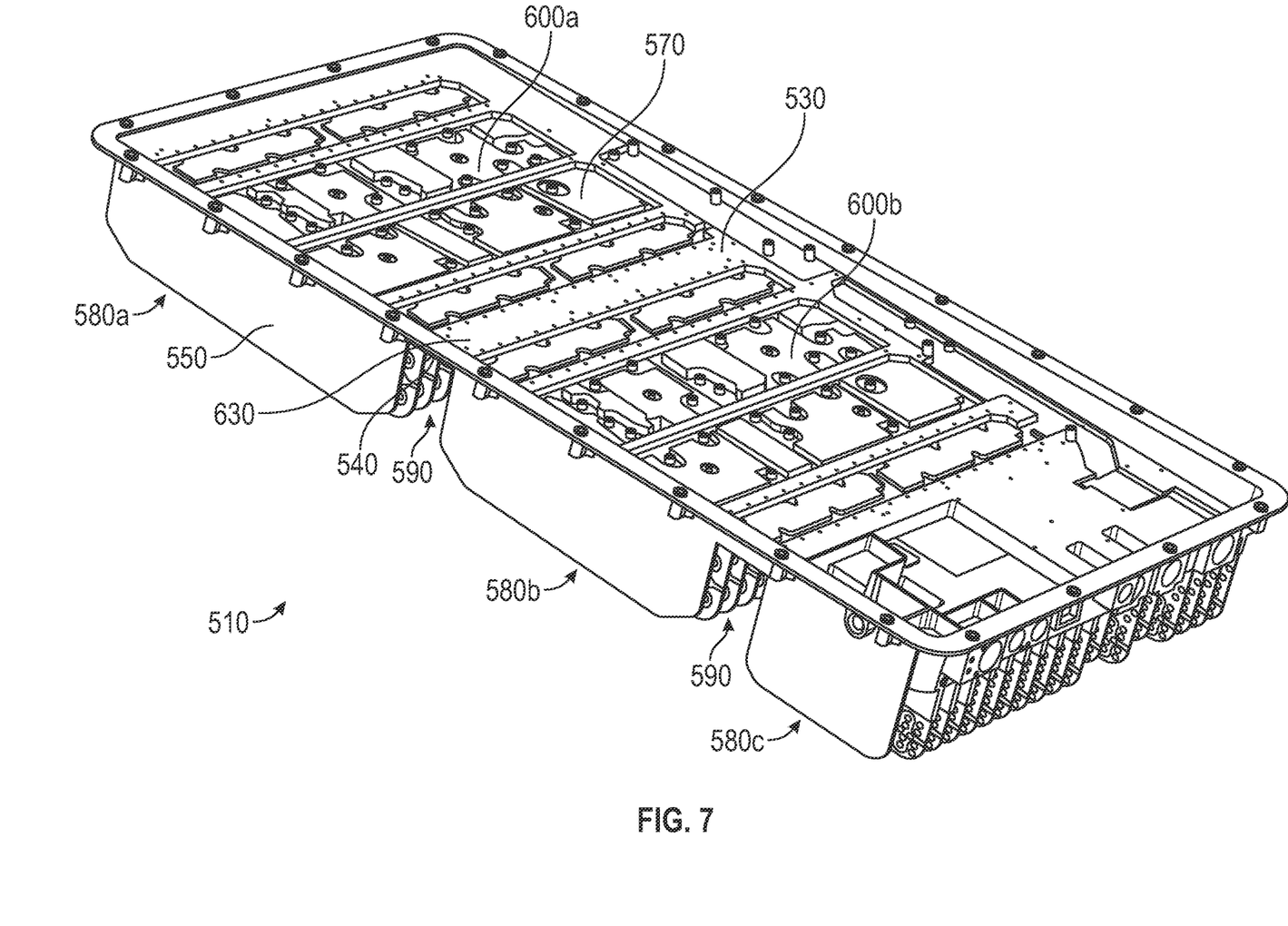
FIG. 7 is a chassis component of the device of FIG. 5.
Figure 8:
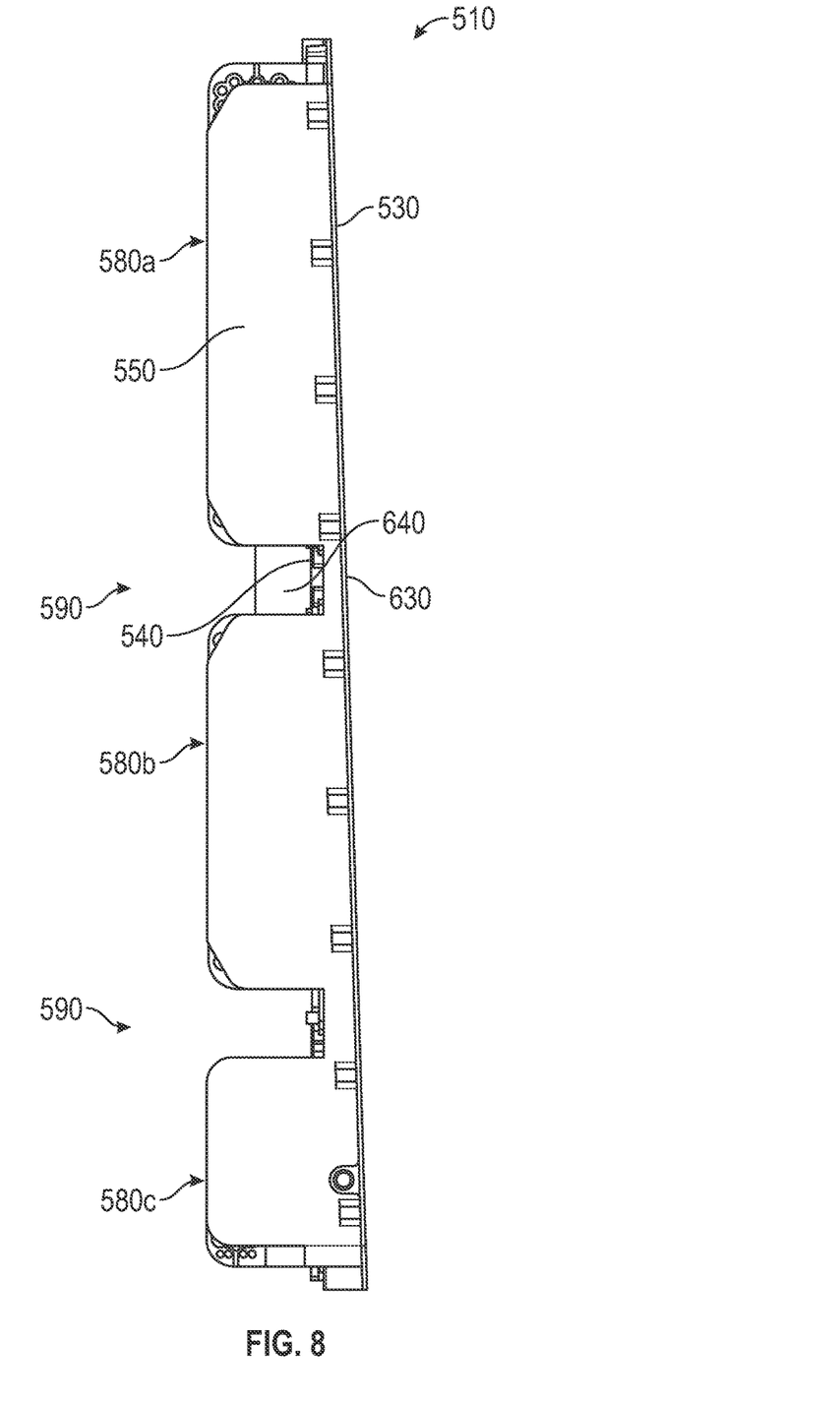
FIG. 8 is a side view of the chassis component of FIG. 7.
Figure 9:
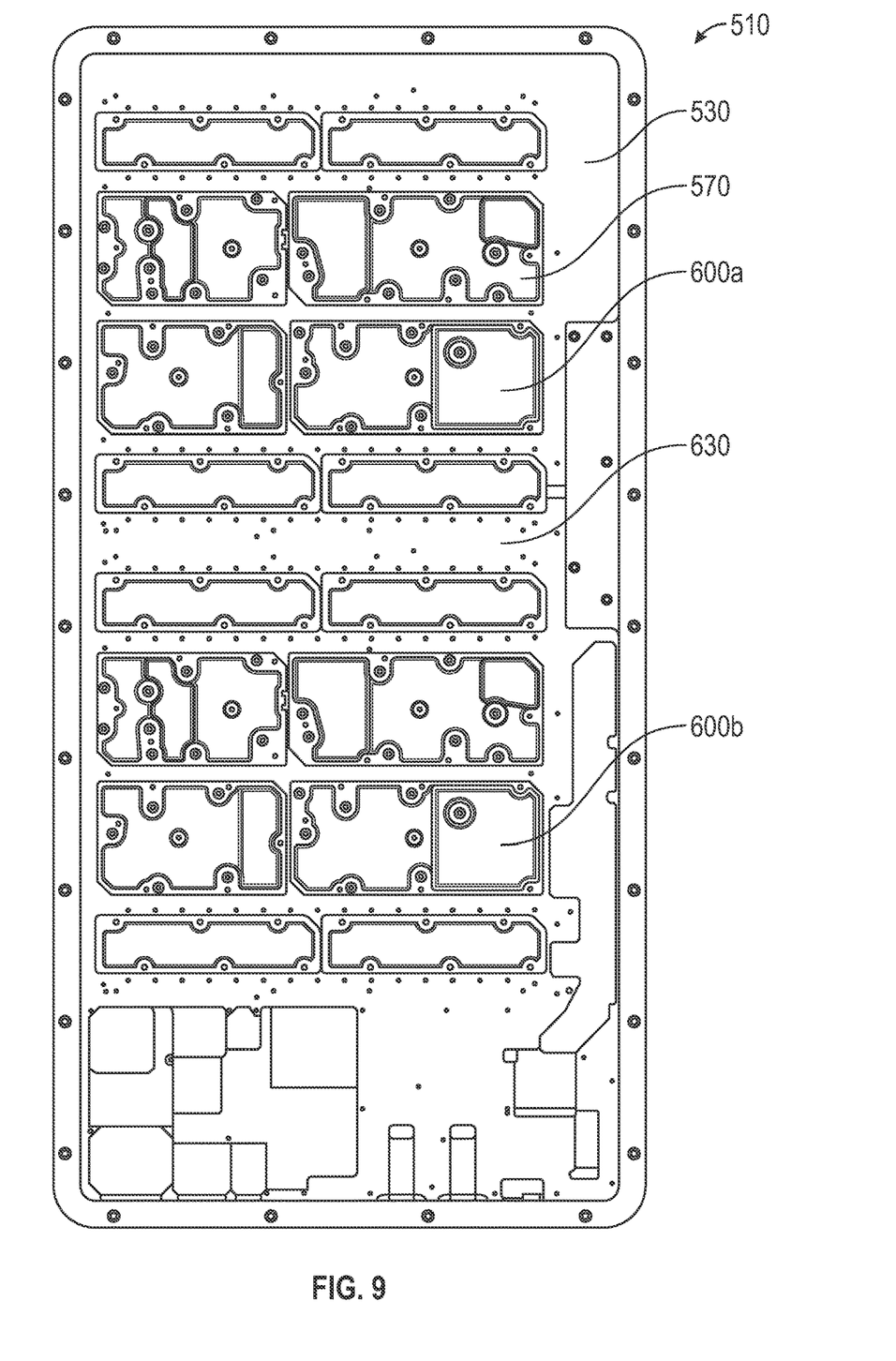
FIG. 9 is a top view of the chassis component of FIG. 7.
Figure 10:
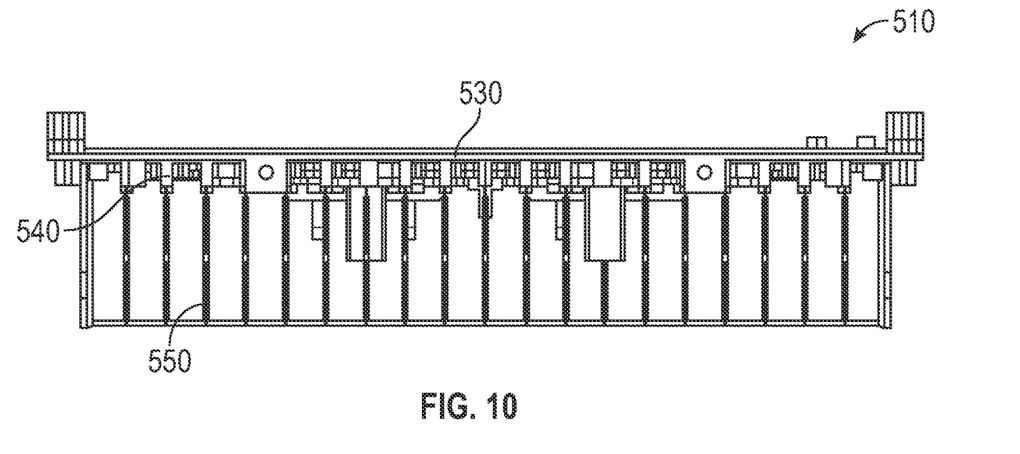
FIG. 10 is a section view of circuitry for use in the device of FIG. 5.

FIG. 5 is a perspective view of a device 500 in accordance with this disclosure. FIG. 6 is an exploded view of the device 500 of FIG. 5. FIG. 7 is a chassis component 510 of the device 500 of FIG. 5. FIG. 8 is a side view of the chassis component 510 of FIG. 7. FIG. 9 is a front view of the chassis component 510 of FIG. 7. FIG. 10 is a top view of a section of the chassis component 510 of FIG. 7.

Figure 12:
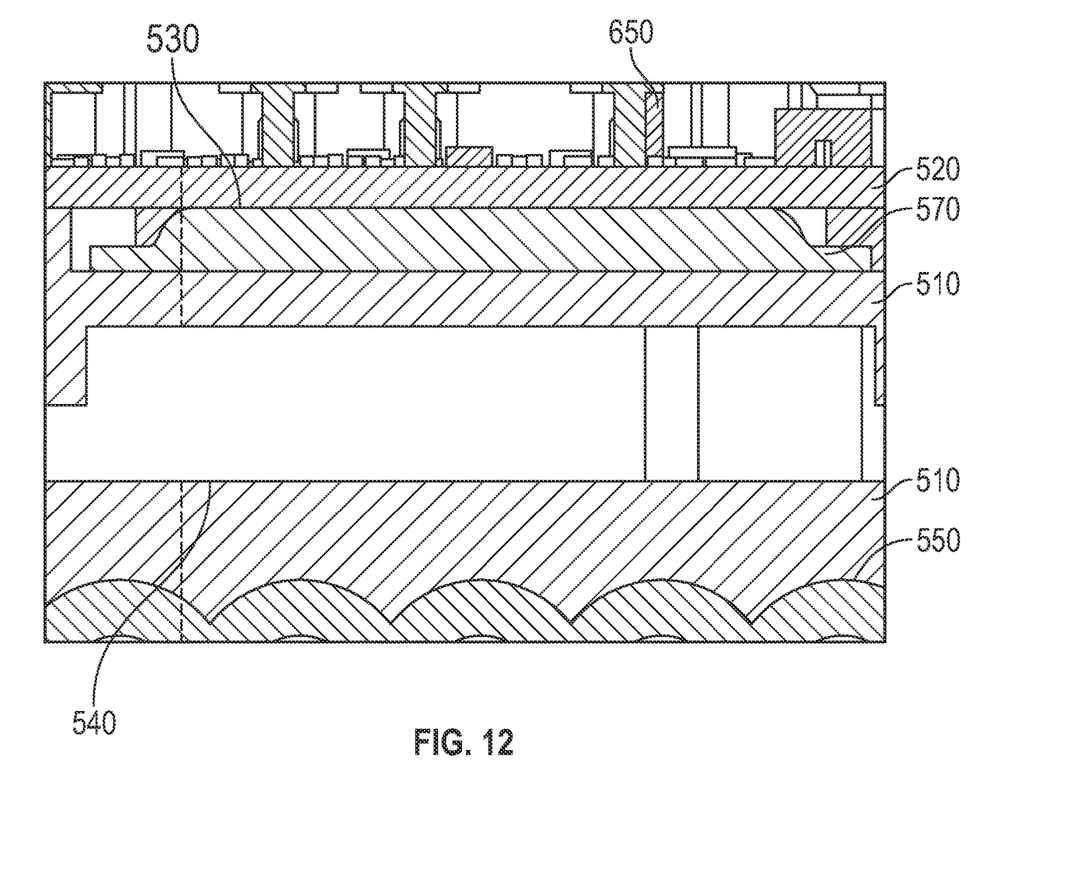
FIG. 12 is a section view of a portion of the device of FIG. 5 with circuitry applied.

FIG. 10 is a section view of circuitry 520 for use in the device of FIG. 5. FIG. 12 is a section view of a portion of the device and corresponding chassis component 510 of FIG. 5 with circuitry 520 applied.

As shown, a device 500 is provided including a chassis 510 for supporting electronic device circuitry 520. The device generally has a mounting surface 530 on a first side of the chassis 510 and a cooling surface 540 on a second side of the chassis opposite the mounting surface. The chassis 510 generally functions as a heatsink for electronics mounted on the mounting surface 530, and the cooling surface 540 has a plurality of heatsink fins 550.

During use, when fully assembled, the electronic device circuitry 520 is mounted on the mounting surface 530 and is enclosed by a housing 560. Heat generated by the device circuitry is then directed towards the mounting surface 530 and is received by the cooling heatsink fins 550 mounted on the cooling surface 540 opposite the location of the circuitry 520 on the mounting surface 530.

As shown, at least one vapor chamber 570 is then provided in the chassis 510 between the mounting surface 530 and the cooling surface 540. Accordingly, the vapor chamber 570 is within a thickness of the chassis 510 itself. The vapor chamber 570 is then located adjacent the plurality of heatsink fins 550.

It will be understood that the vapor chamber 570 may be integrated into the chassis 510 in a variety of ways. Accordingly, the vapor chamber 570 may be part of a casting of the chassis 510. As such, when the chassis 510 is initially cast, the vapor chamber 570 is integrated into the device, such that one side of the vapor chamber 510 is either integrated into or adjacent the cooling surface 540 and a second opposite side of the vapor chamber is either integrated into or adjacent the mounting surface 530. Alternatively, the chassis 510 may be cast with detents or designated locations for the vapor chamber 570, such that the vapor chamber is fixed to the chassis after casting. In such an embodiment, one side of the vapor chamber 570, once fixed in place, is adjacent the cooling surface 540 and the second side opposite the first side of the vapor chamber becomes integrated into the mounting surface 530 or is used as the mounting surface. It will be understood that additional variations are contemplated as well.

It will further be understood that in various embodiments, more than one vapor chamber 570 will be utilized in a single chassis 510, and such vapor chambers may be strategically located. This will be discussed in more detail below.

In some embodiments, as shown, the heatsink fins 550 may be organized into multiple fin sections 580a, b, c, with each fin section includes a set of heatsink fins 550. Accordingly, a first fin section 580a comprises a first set of fins 550 and a second fin section 580b comprises a second set of fins 550. The chassis 510 may then include a thermal break 590 in between the first fin section 580a and the second fin section 580b. such a thermal break 590 may be an air gap defining a channel between the first fin section 580a and the second fin section 580b.

Such a thermal break 590 may function to allow airflow to pass through the channel formed between the first fin section 580a and the second fin section 580b. Such airflow allows cooling air to come from sides of the device, allowing for additional convection. As such, cooling air may come from the sides while air heated by the fins 550 may dissipate from the back of the unit, adjacent ends of the fins. Additional thermal control features may be implemented in the thermal breaks 590, such as aerofoils (not shown), in order to further control airflow within the device, and to control relative convention and cooling between the first and second fin sections 580a, b.

The vapor chambers 570 may generally be located so as to coordinate with the locations of circuitry 520 on the mounting surface 530 and with the locations of cooling fins 550 on the cooling surface 540. As such, multiple groupings of circuitry or multiple circuit boards 520, such as PCBs, may be provided mounting on a single chassis 510, and multiple vapor chambers 570 may be provided to support such circuitry. Each such grouping of circuitry or circuit board 520 may have a thermal load and cooling requirement, and the requirements associated with different circuit boards may be different.

In such an embodiment, a first vapor chamber 600a of the plurality of vapor chambers 570 may be located between a first mounting location of the mounting surface 530 designated for the first circuit board 620a and the first fin section 580a on the cooling surface 540. Similarly, a second vapor chamber 600b may be located between a second mounting location of the mounting surface 530 designated for the second circuit board 620b and the second fin section 580b on the cooling surface.

In some such embodiments, the first vapor chamber and the second vapor chamber 600a, b are each sized or otherwise configured to meet thermal loads associated with a specified PCB 620a, b, or other circuitry, to be mounted at the corresponding mounting location. In some embodiments, multiple vapor chambers are associated with each circuit board 620a, b, and such vapor chambers 600a, b may be coordinated with specific groupings of circuitry 520 on each such circuit board.

In some embodiments, such as that shown, the vapor chambers 600a, b are located adjacent the corresponding fin sections 580a, b, and no vapor chamber 570 is located at a mounting surface section 630 adjacent a thermal break 590. In this way, the vapor chambers 600a, b are optimized to transfer heat to the cooling fins 550 so that the heat can be dissipated.

Where multiple vapor chambers 570 are associated with and located adjacent each of multiple fin sections 580a, b, each such vapor chamber 600a, b may be located to coordinate with specific circuitry 520. Accordingly, the electronic device circuitry 520 may include a plurality of printed circuit boards 620a, b, as discussed above, and a first plurality of vapor chambers 570, which may include the first vapor chamber 600a, is located between a mounting location for the first printed circuit board 620a on the mounting surface 530 and the first fin section 580a on the cooling surface 540. A second plurality of vapor chambers 570, which may include the second vapor chamber 600b, is then located between a mounting location for the second printed circuit board 620b on the mounting surface 530 and the second fin section 580b on the cooling surface 540.

Each printed circuit board (PCB) 620a, b may then include several groupings of circuitry 520 with discrete thermal management requirements. The vapor chambers 570 of the first plurality of vapor chambers and the second plurality of vapor chambers are then configured to be located adjacent corresponding groupings of circuitry 520. Each vapor chamber 570 may then be sized for the thermal management requirements of the corresponding grouping of circuitry 520.

For example, each PCB 620a, b may include at least four field programmable gate arrays (FPGAs). Each FPGA may then be associated with a corresponding vapor chamber 570.

Figure 11:
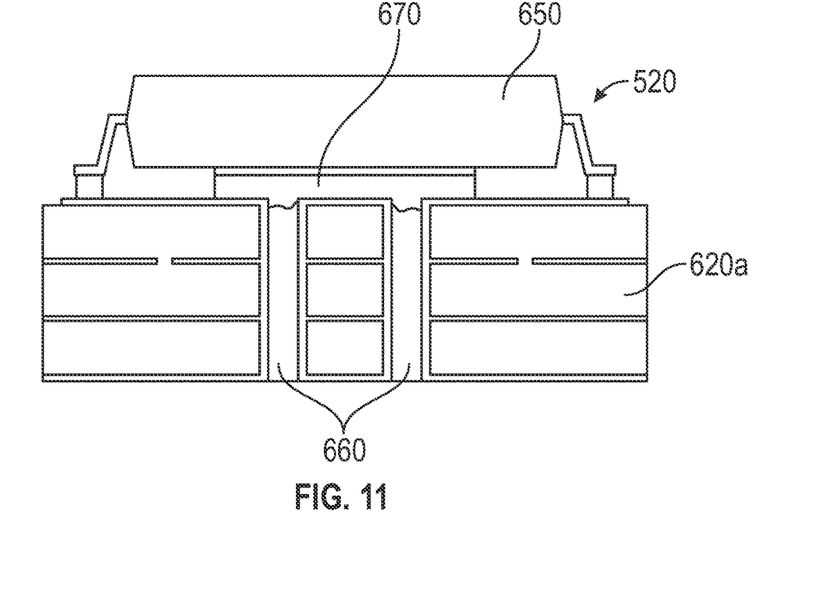
FIG. 11 is a section view of a printed circuit board supporting an electronic device for use in the device of FIG. 5.

In some embodiments, at least one of the PCBs 620a may include an electronic device 650 surface mounted on the PCB. In such a scenario, the PCB 620a intercedes between the electronic device 650 and the mounting surface 530 of the chassis 510. The PCB 620a may then be provided with thermal vias 660 defining a thermal path between the electronic device 650 and the mounting surface 530. In some such embodiments, the electronic device 650 is an integrated circuit die, and it may be mounted on a die-attach paddle 670 or other die fixation element. In such an embodiment, the thermal vias 660 may be positioned adjacent the die-attach paddle 670, such that heat may be drawn from the paddle to the adjacent mounting surface 530 through the corresponding PCB 620a.

Each of the heatsink fins 550 may be a pressed or bonded fin. Alternatively, or in addition, each heatsink fin 550 may comprise at least two materials.

In some embodiments, each heatsink fin 550 may comprise at least one integrated fluid path. Such heatsink fins may be 2-phase fins.

In some such embodiments, a first and last fin 550 may differ from other fins in the chassis 510. As such, the first and last fin 550 may be integrated into or die cast with the chassis 510, while other fins may be fixed to the chassis later, or may be formed from different materials or incorporate different structures.

As discussed above, the heatsink fins 550 may be sized, spaced, and shaped to optimize thermal management of the device. Further, the fins 550 and corresponding thermal breaks 590 may be positioned in concert with the vapor chambers 570 so as to optimize thermal management in concert, and to customize such thermal management to the specific thermal loads associated with circuitry to be mounted on the mounting surface 530.

Additional thermal management features may be integrated into the chassis 510 as well. In some embodiments, supports 640 may be provided in or adjacent the thermal breaks 590, such that cooling or thermal control elements may be utilized. For example, in some embodiments, an aerofoil (not shown) may be incorporated by mounting on the supports in order to control cooling of fins by air passing through the thermal breaks 570.

In some embodiments, the chassis 510 itself comprises a high pressure die cast base. In some embodiments, the device 500 may be fan cooled. As such, a fan module may be mounted adjacent a first end of the cooling surface 540.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A chassis for electronic device circuitry, the chassis comprising:
   a mounting surface on a first side of the chassis;
   a cooling surface on a second side of the chassis opposite the mounting surface, the cooling surface having a plurality of heatsink fins;
   at least one vapor chamber between the mounting surface and the cooling surface, the at least one vapor chamber located adjacent the plurality of heatsink fins,
   the chassis further comprising at least one thermal break, and wherein the plurality of heatsink fins is organized into at least two fin sections, wherein a first fin section of the at least two fin sections comprises a first set of fins of the plurality of fins and a second fin section of the at least two fin sections comprises a second set of fins of the plurality of fins, and wherein the at least one thermal break is an air gap defining a channel between the first fin section and the second fin section,
   wherein a first vapor chamber of the at least one vapor chamber is adjacent the first fin section, a second vapor chamber of the at least one vapor chamber is adjacent the second fin section, and no vapor chamber is adjacent the thermal break,
   wherein the electronic device circuitry comprises a plurality of printed circuit boards (PCBs) and wherein each of the first vapor chamber and the second vapor chamber are located between a corresponding PCB mounting location on the mounting surface and the corresponding fin section on the cooling surface,
   wherein at least one of the PCBs includes an electronic device surface mounted on the PCB such that the PCB intercedes between the electronic device and the mounting surface, and wherein the PCB further comprises thermal vias defining a thermal path between the electronic device and the mounting surface,
   wherein the electronic device surface mounted is an integrated circuit die mounted on a die-attach paddle, and wherein the thermal vias are adjacent the die-attach paddle.

2. The chassis of claim 1, wherein the first vapor chamber and the second vapor chamber are sized to meet thermal loads associated with a specified PCB to be mounted at the corresponding PCB mounting location.

3. A chassis for electronic device circuitry, the chassis comprising:
   a mounting surface on a first side of the chassis,
   a cooling surface on a second side of the chassis opposite the mounting surface, the cooling surface having a plurality of heatsink fins;
   at least one vapor chamber between the mounting surface and the cooling surface the at least vapor chamber located adjacent the plurality of heatsink fins;
   the chassis further comprising at least one thermal break, and wherein the plurality of heatsink fins is organized into at least two fin sections, wherein a first fin section of the at least two fin sections comprises a first set of fins of the plurality of fins and a second fin section of the at least two fin sections comprises a second set of fins of the plurality of fins, and wherein the at least one thermal break is an air gap defining a channel between the first fin section and the second fin section,
   wherein a first plurality of vapor chambers of the at least one vapor chamber is adjacent the first fin section, a second plurality of vapor chambers of the at least one vapor chamber is adjacent the second fin section, and no vapor chamber is adjacent the thermal break.

4. The chassis of claim 3, wherein the electronic device circuitry comprises a plurality of printed circuit boards (PCBs) and wherein each of the first plurality of vapor chambers and the second plurality of vapor chambers are located between a corresponding PCB mounting location on the mounting surface and the corresponding fin section on the cooling surface, and wherein each PCB comprises several groupings of circuitry with discrete thermal management requirements, and wherein vapor chambers of the first plurality of vapor chambers and the second plurality of vapor chambers are configured to be located adjacent corresponding groupings of circuitry, and wherein each vapor chamber is sized for the thermal management requirements of the corresponding grouping of circuitry.

5. The chassis of claim 4, wherein each PCB comprises at least four field programmable gate arrays (FPGAs), and wherein each FPGA is associated with a corresponding vapor chamber.

6. The chassis of claim 1 wherein each fin of the plurality of heatsink fins is a pressed or bonded fin.

7. The chassis of claim 1 wherein each fin of the plurality of heatsink fins comprises at least two materials.

8. The chassis of claim 1 wherein each fin of the plurality of heatsink fins comprises at least one integrated fluid path.

9. The chassis of claim 8 wherein each fin of the plurality of heatsink fins is a 2-phase fin.

10. The chassis of claim 1 wherein each of the heatsink fins is spaced and sized to optimize thermal management of the device.

11. The chassis of claim 10, wherein the heatsink fin quantity, pitch, and size are customized based on printed circuit boards to be mounted on the mounting surface.

12. The chassis of claim 1 wherein the device chassis comprises a high pressure die cast base.

13. The chassis of claim 1 further comprising a fan module mounted adjacent a first end of the cooling surface.

\* \* \* \* \*